(12) United States Patent
Saito

(10) Patent No.: US 7,640,946 B2
(45) Date of Patent: Jan. 5, 2010

(54) VACUUM TREATING DEVICE WITH LIDDED TREATMENT CONTAINER

(75) Inventor: Tetsuya Saito, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 422 days.

(21) Appl. No.: 10/544,708

(22) PCT Filed: Feb. 6, 2004

(86) PCT No.: PCT/JP2004/001253

§ 371 (c)(1),
(2), (4) Date: Aug. 5, 2005

(87) PCT Pub. No.: WO2004/070814

PCT Pub. Date: Aug. 19, 2004

(65) Prior Publication Data

US 2006/0099053 A1    May 11, 2006

(30) Foreign Application Priority Data

Feb. 6, 2003   (JP) .............................. 2003-029895

(51) Int. Cl.
*F17D 1/02* (2006.01)
(52) U.S. Cl. ..................... 137/571; 414/217; 141/8; 141/65; 141/98; 118/715; 438/758
(58) Field of Classification Search ................ 414/217; 141/8, 65, 98; 438/758; 137/571; 118/715
See application file for complete search history.

(56) References Cited

U.S. PATENT DOCUMENTS

| | | | | |
|---|---|---|---|---|
| 4,268,275 A | * | 5/1981 | Chittick | 48/111 |
| 5,791,830 A | * | 8/1998 | Fort et al. | 406/151 |
| 6,009,667 A | | 1/2000 | Mizukami | |
| 6,048,782 A | * | 4/2000 | Moslehi | 438/565 |
| 6,565,662 B2 | | 5/2003 | Amano et al. | |

FOREIGN PATENT DOCUMENTS

| | | |
|---|---|---|
| JP | 61-138238 | 8/1986 |
| JP | 10-299900 | 11/1998 |
| JP | 11-101345 | 4/1999 |
| JP | 2000-317296 | 11/2000 |
| JP | 2001-185534 | 7/2001 |
| JP | 2001-335941 | 12/2001 |
| JP | 2002-134383 | 5/2002 |
| JP | 2003-100697 | 4/2003 |
| JP | 2003-197613 | 7/2003 |

* cited by examiner

*Primary Examiner*—Michael S Lowe
(74) *Attorney, Agent, or Firm*—Oblon, Spivak, McClelland, Maier & Neustadt, L.L.P.

(57) ABSTRACT

A vacuum treating device, comprising a treatment container having a container body (111) and a lid (112) and allowing an internal pressure to be reduced and a lid support mechanism (130), wherein an upper opening (111a) formed in the container body can be closed airtight by the lid (112). The lid support mechanism (130) opens and closes the upper opening (111a) of the container body by moving the lid (112) so as to be translatingly moved in the vertical direction and, when the lid (112) is moved upward from the container body (111), supports the lid (112) so as to be rotated around a vertical axis disposed around the lid.

14 Claims, 4 Drawing Sheets

VACUUM TREATING DEVICE WITH LIDDED TREATMENT CONTAINER

FIELD OF THE INVENTION

The present invention relates to a vacuum processing apparatus having a lid-attached processing vessel for use in a film forming process of, e.g., semiconductor substrate.

BACKGROUND OF THE INVENTION

Conventionally, a vacuum processing apparatus has been used for performing on a semiconductor substrate, an LCD substrate or the like, various processes such as film forming process, etching, ashing, heat treatment and the like, under a depressurized atmosphere. In such an apparatus, a processing vessel for performing vacuum processing includes a vessel main body having an upper opening, and a lid attached to the vessel main body to be opened or closed. Further, as for this kind of apparatus, it has been known that a lid is rotatably attached to the vessel main body around the horizontal axis line through a hinge or the like.

For example, an opening/closing lid hinge mechanism of a vacuum processor has been known, wherein a gear mechanism is configured to open or close a lid around a horizontal axis line along a longitudinally elongated elliptic path (for example, see Japanese Patent Laid-open application No. H11-101345 (particularly, FIG. 2)). By this mechanism, the lid can be opened or closed without being overhung at the outside of the vessel main body.

Further, a vacuum processor including a slide mechanism for horizontally sliding a lid and a rotation mechanism for rotating the lid around the horizontal axis line has been known (for example, see Japanese Patent Laid-open Application No. 2001-185534 (particularly FIG. 6)). By using this mechanism, maintenance becomes easier, and at the same time, attaching or detaching a heavy object to or from the lid can be readily carried out.

However, in the former technology, a complicated mechanism needs to be provided to track the longitudinally elongated elliptic path during the opening or closing operation. Further, multiple or large-scale mechanism(s) need to be disposed around the lid to perform the sliding or rotational operation. Accordingly, the processor becomes expensive and large sized.

Still further, in these technologies, since the lid is rotated around the horizontal axis line to fully open the vessel main body, such a configuration cannot be adopted that a part of the processor (e.g., source material supply system) is disposed above the lid. As a result, not only is the foot print of the processor increased, the capability to maintain it is also undermined.

Still further, recently, there is a demand for a vacuum processing apparatus, wherein a source gas is produced by vaporizing a liquid source material or sublimating a solid source material, and is then supplied into a processing vessel. In this kind of apparatus, the conductance of a line provided between the source material vessel and the processing vessel has to be increased to ensure a supply amount of source gas, or to smoothly supply the source gas into the processing vessel. For this, the line provided between the source material vessel and the processing vessel must have a large diameter and short in length. However, in the configuration of the conventional apparatus, the line provided between the source material vessel and the processing vessel could not be made short.

Further, in the aforementioned technologies, since the lid is rotated around the horizontal axis line, if the source material vessel is fixed on the lid, the source material vessel will be tilted and thus, the source material accommodated therein is also tilted and cause other changes on the source material. Accordingly, a proper supply amount of source material cannot be achieved.

SUMMARY OF THE INVENTION

It is, therefore, an object of the present invention to provide a vacuum processing apparatus of simple configuration that can be configured at low cost, wherein other component part, such as source material supply system and the like, may be disposed above the lid.

Further, it is an object of the present invention to provide a vacuum processing apparatus capable of having a short pipeline distance between a source material vessel and a processing vessel.

Still further, it is an object of the present invention to provide a vacuum processing apparatus capable of realizing such a configuration where the state of source material is not changed by opening or closing of the lid.

In accordance with a preferred embodiment of the present invention for achieving the aforementioned objects, there is provided a vacuum processing apparatus including: a processing vessel whose inside can be depressurized, the processing vessel including a vessel main body having an upper opening and a lid for airtightly closing the upper opening of the vessel main body; and a lid support mechanism for opening or closing the upper opening of the vessel main body by moving the lid, wherein the lid support mechanism allows the lid to be translated in a vertical direction, and to be rotated around a vertical axis line disposed at a peripheral position of the lid when the lid is elevated from the vessel main body.

In this way, the lid is translated upward and then rotated around the vertical axis line, to thereby be dislocated from the vessel main body. Therefore, the upper opening of the vessel main body can be opened. Here, since the lid is translated upward and then rotated around the vertical axis line, other component part may be disposed at a position above the lid, which was dead space conventionally. Further, the lid support mechanism may be formed of supporting structure, which is installed coaxially on the vertical axis line, so that the configuration thereof need not be complicated and large sized. Still further, since the processing vessel can be opened while maintaining the lid's orientation at horizontal position, the source material therein may not be affected when the processing vessel is opened, even in case where the source material vessel is fixed on the lid.

Meanwhile, same as in the conventional art, if the lid is opened around the horizontal axis line, it is largely rotated upward, and thus, it being tilted or reversed. For the same reason, it is impossible to dispose a part of the processor above the lid, or to fix the source material vessel on the lid.

Further, it can be configured such that if the lid is not elevated at a predetermined height, it is not allowed to rotate. By doing this, the vessel main body or the lid can be prevented from being damaged due to erroneous manipulation.

In the present invention, the lid support mechanism may be configured to maintain the lid at a predetermined height while the lid is rotated. By doing this, a height-maintaining operation of the lid becomes unnecessary during the rotation thereof, so that it is possible to carry out the rotating operation safely and more readily.

In the present invention, the lid support mechanism may have a supporting member for supporting the lid directly or indirectly, wherein the supporting member is extended substantially horizontally above the lid from the vicinity of the vertical axis line. Therefore, it is possible to maintain the pose or position of the lid with high accuracy.

In the present invention, a lifting unit for upwardly lifting the lid may be further included. By using this, in case of elevating the lid, it is possible to carry out such an elevating operation with small force, and thus, more easily.

In the present invention, a source material vessel, disposed above the lid, for accommodating therein a source material supplied into the processing vessel may be further included. In this way, the pipeline distance between the source material vessel and the processing vessel can be short, and at the same time, the diameter of line can be large without increasing the foot print. Thus, the conductance of line between the source material vessel and the processing vessel can be large. For the same reason, in case where the source gas obtained by vaporizing the liquid source material or sublimating the solid source material is supplied into the processing vessel, the amount of source gas to be supplied can be ensured sufficiently. Further, the source gas can be prevented from being changed while supplying it, so that high quality processing can be performed.

In the present invention, it is preferred that the source material vessel is immovably disposed with respect to the lid. By doing this, for example, the supply line between the source material vessel and the lid can be configured to be fixed, and therefore, the apparatus may have more simple configuration.

Further, a source material supply line for supplying a source material from an upper portion of the lid into the processing vessel through the lid may be included. By using this, the lid is maintained at the horizontal position during the opening or closing operation thereof, so that the source material supply line may be connected to the lid without causing any problems. Hence, the source material supply line may be fixed to the lid, and further, the position thereof is not changed.

In this case, a gas supply line extended through the lid to the upper portion thereof and connected to the source material supply line may be further included.

Further, the vacuum processing apparatus may include any apparatus, which performs any processings at the state where the processing vessel is depressurized. For example, film forming apparatus such as CVD, etching apparatus such as dry etching, ashing apparatus such as plasma asher, heat treating device such as annealing furnace, etc., may be enumerated.

DETAILED DESCRIPTION OF THE PREFERRED EMBODIMENT

A Preferred embodiment of a vacuum processing apparatus in accordance with the present invention will be described in detail with reference to the accompanying drawings.

Figure 1:
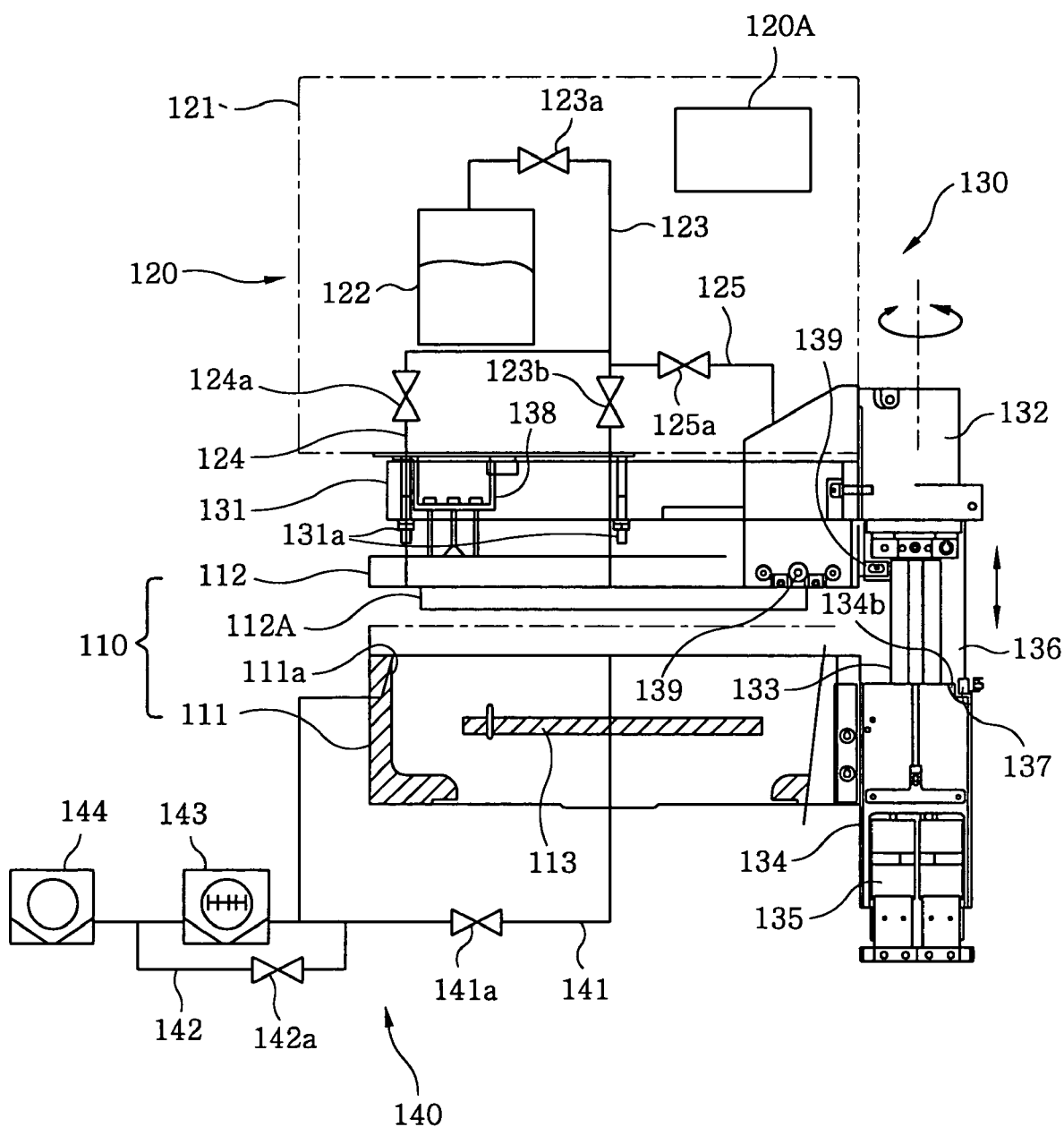
FIG. 1 offers a schematic view showing a preferred embodiment of a vacuum processing apparatus in accordance with the present invention.

FIG. 1 is a schematic view showing an overall configuration of a vacuum processing apparatus 100 in accordance with the present embodiment. The vacuum processing apparatus 100 includes a processing vessel 110, a source material supply system 120, a lid support mechanism 130 and a gas exhaust system 140.

The processing vessel 110 contains a vessel main body 111 having an upper opening 111a, and a lid 112 for hermetically closing the upper opening 111a of the vessel main body 111.

Further, in the vessel main body 111, a processing table 113 for supporting thereon an object to be processed, such as semiconductor wafer or the like (not shown), is disposed. A source material discharging head (shower head) for discharging a source material (source gas) into the processing vessel 110 is installed at a bottom surface of the lid 112.

The source material supply system 120 is disposed above the lid 112. The source material supply system 120 includes a source material supply box 121 having a source material vessel 122 accommodating therein a source material (liquid or solid in the present embodiment) and a source material supply line 123 for supplying a source material (source gas in the present embodiment), which is connected to the source material vessel 122. Further, a control unit 120A for controlling the source material supply status may be installed in the source material supply system 120.

The source material supply line 123 is connected to a discharging head 112A through the lid 112. A source material replacement valve 123a and a source material supply valve 123b are provided in the source material supply line 123. Further, a gas discharge line 124 is connected to the source material supply line 123. A discharge valve 124a is installed in the gas discharge line 124. The gas discharge line 124 penetrates the lid 112 and the vessel main body 111 to communicate with the outside of the vessel main body 111. Further, one or more gas supply line(s) 125 is (are) connected to the source material supply line 123. A gas supply valve 125a is installed in the gas supply line 125.

Figure 4:
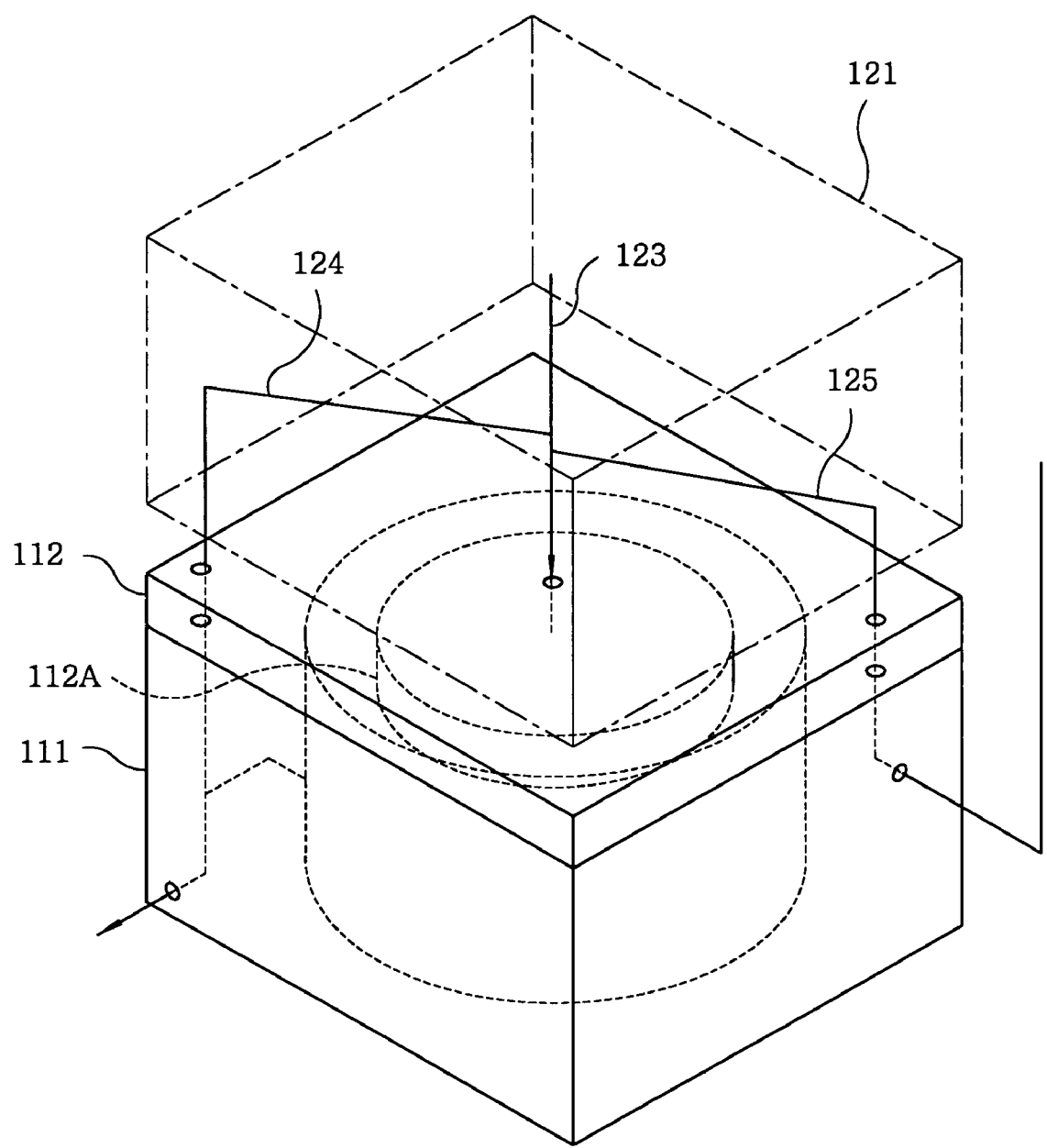
FIG. 4 presents a perspective view schematically showing line configuration of the apparatus described in FIG. 1.

The gas supply line 125 involves supplying carrier gas or cleaning gas for cleaning each line or processing vessel. As schematically shown in FIG. 4, the gas supply line 125 is introduced from the outside into the vessel main body 111, and penetrates the lid 112 to be introduced into the source material supply box 121, to thereby be connected to the source material supply line 123. Further, in FIG. 4, the lid support mechanism 130 and others as well as valves of respective lines are properly omitted.

Figure 3:
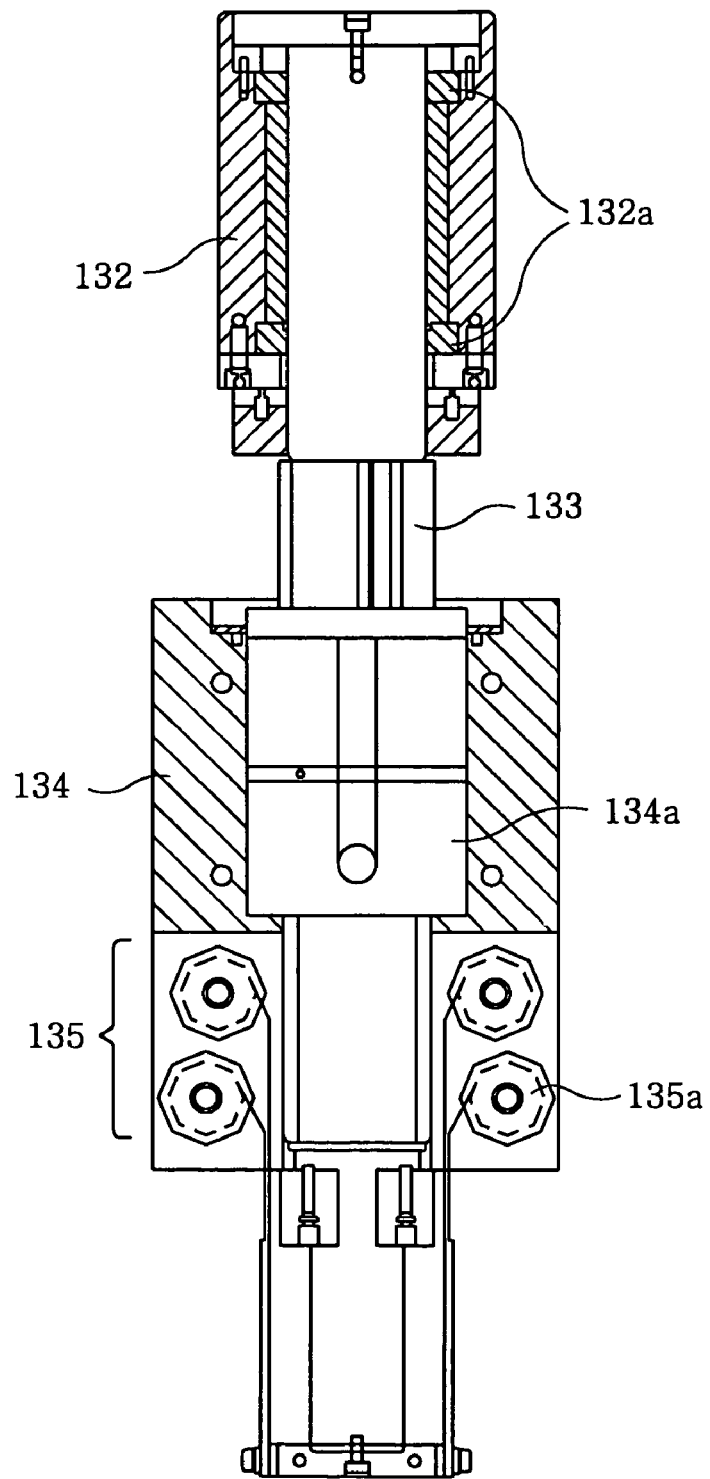
FIG. 3 is a cross sectional view showing main parts of an opening/closing supporting unit in the apparatus described in FIG. 1.

Returning again to FIG. 1, a lid support member 131 is disposed above the lid 112. The lid support member 131 supports the lid 112 directly or indirectly. The lid support member 131 is connected to a driving member 132, which is rotatably supported with respect to a shaft 133 inserted therein. More specifically, as shown in FIG. 3, a bearing 132a, e.g., cross roller bearing or the like, is interposed between the driving member 132 and the shaft 133, and the driving member 132 is configured to be fixed along the direction of axis line while it is to be rotated around the axis line, with respect to the shaft 133.

The axis line (vertical axis line) of the shaft 133 is disposed at a peripheral position of the lid 112 (position other than the center), e.g., right outside the lid 112 in the present embodiment.

The shaft 133 is elevatably supported with respect to a fixed member 134 fixed on the vessel main body 111. To be more specific, as shown in FIG. 3, the fixed member 134 has a guide unit 134a, e.g., ball spline or the like, for fixing the shaft 133 so that it can be moved along the direction of the axis line but cannot be rotated around the axis line.

As mentioned above, the lid support mechanism 130 allows the lid 112 to be translated in the normal direction to the vessel main body 111, and be rotated around the vertical axis line disposed at the peripheral position of the lid 112.

At a lower portion of the fixed member 134, a lifting unit 135 for upwardly moving the shaft 133 is installed. As described in FIG. 3, the lifting unit 135 applies lifting force to the shaft 133 by using a resilient member 135a, e.g., constant force spring or the like. Further, the lid 112 is configured to be readily elevated by the lifting unit 135.

Figure 2:
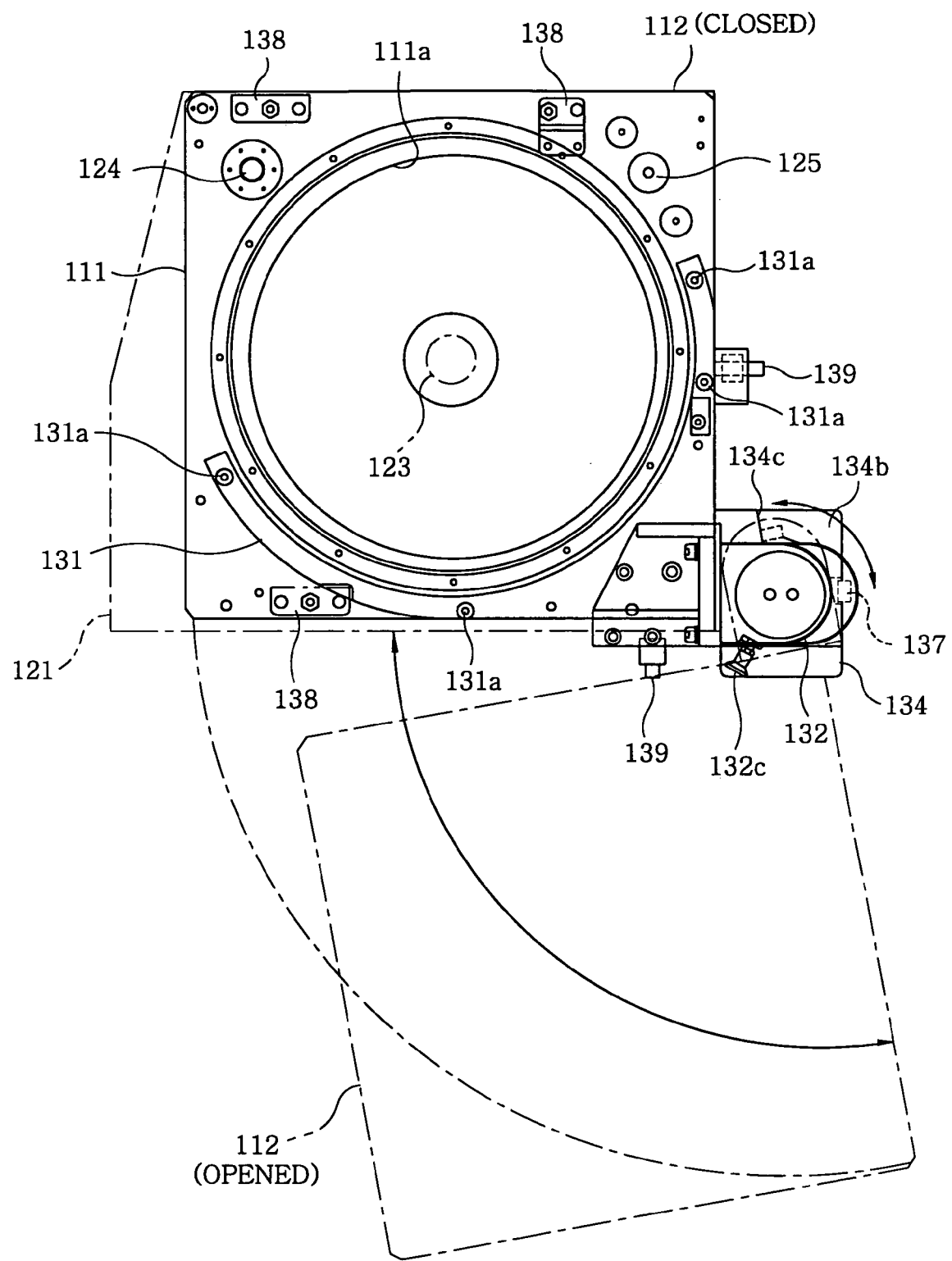
FIG. 2 provides a plane perspective view of the apparatus described in FIG. 1.

In the present embodiment, the source material supply box 121 is upwardly supported by the lid support member 131. Further, the lid 112 is supported by brackets 138 attached to the source material supply box 121. FIG. 2 illustrates such a state in detail. FIG. 2 shows a top view of the vacuum processing apparatus 100, and at the same time, perspective views of the source material supply box 121 and the lid 112. FIG. 2 basically shows a state where the vessel main body 111 is closed by the lid 112; and at the same time, it shows as a dashed double-dotted line a state where the lid 112 is opened (rotated state).

Here, plural (three in the drawing) brackets 138 are provided to support the lid 112, which is suspended from the source material supply box 121. As mentioned above, in this embodiment, the lid support member 131 indirectly supports the lid 112 through the source material supply box 121 and the brackets 138.

At the lid support member 131, plural horizontal position adjusting mechanisms 139 formed of positioning screws, dial gauge and the like are installed. By these horizontal position adjusting mechanisms 139, the lid 112 supported indirectly by the lid support member 131 as described above can be positioned in the horizontal direction. To be more specific, position or direction of the lid 112 on a the horizontal plane can be adjusted by the plural horizontal position adjusting mechanisms, which carry out positioning at various positions in the horizontal direction (in the drawing, two horizontal position adjusting mechanisms (139,139), which perform positioning in different directions normal to each other).

Further, at the lid support member 131, plural vertical position adjusting mechanisms 131a for adjusting the vertical position of the lid 112 are installed. The height of the lid 112 may be adjusted by these vertical position adjusting mechanisms 131a. Moreover, the height of the lid 112 is adjusted by using the plural vertical position adjusting mechanisms 131a, which are separated from each other in the horizontal direction, so that the inclination level of the lid 112 is adjusted.

To be more specific, each of the vertical position adjusting mechanisms 131a attached to the lid support member 131 is configured to adjust the height of the source material supply box 121 with respect to the lid support member 131, and thus, adjusting the height of the lid 112 indirectly.

At the lid support mechanism 130, a rotation lock unit (plunger) 132c for fixing the rotation of the lid 112 is installed. The rotation lock unit (plunger) 132c fixes the driving member 132 and the shaft 133 in the rotation direction all the time, and such locked state is released by performing a predetermined operation (e.g., unloading operation).

Further, there is installed a raised position keeping unit for keeping the lid 112 at a raised position of predetermined height when the lid 112 is elevated from the vessel main body 111. As described in FIG. 1, the raised position keeping unit includes a supported material 137 (in the drawing, corresponding to a rotatably supported roller), which is attached to the driving member 132 through a fitting member 136; and a supporting surface 134b (a top surface of the fixing member 134) for upwardly supporting the supported material 137.

As shown by the solid line in FIG. 2, in the state where the lid 112 is disposed on the vessel main body 111 (the upper opening 111a of the vessel main body 111 is closed or it is disposed at a raised position right above the vessel main body 111), the supported member 137 is not supported by the supporting surface 134b in the side of the fixing member 134. Contrary to this, if the lid 112 disposed at the raised position is rotated by a predetermined angle in the horizontal direction, the supported member 137 reaches to the supporting surface 134b of the fixing member 134. In such a state, if the lid 112 is further rotated in the horizontal direction, the supported member 137 moves on the supporting surface 134b (while rotating, in case of a roller).

As mentioned above, since the supported member 137 is supported on the supporting surface 134b, the lid 112 is supported at a predetermined height during the rotation thereof. Further, a stepped portion 134c is formed in the supporting surface 134b to confine the rotation range of the lid 112.

Here, if the lid 112 tends to rotate when it is not elevated at a predetermined height, the supported material 137 will contact the side of the fixing member 134. Accordingly, even though the rotation lock unit 132c is not provided or the rotation lock unit 132c is released, it is possible to control the lid 112 not to rotate if it does not reach a predetermined height.

As shown in FIG. 2, the aforementioned gas exhaust line 124 and the gas supply line 125 are respectively opened around the upper opening 111a on the top surface of the vessel main body 111. The gas exhaust line 124 is connected to the gas exhaust system 140 shown in FIG. 1. Further, in the gas exhaust system 140, a gas exhaust unit such as a turbo molecular pump 143, a dry pump 144 or the like is installed. Still further, a bypass line 142 or valve 141a or 142a may be disposed, if necessary. Still further, the gas supply line 125 is to introduce from the processing vessel 110 into the source material supply box 121 through the lid 112 various gases, which have been supplied into the processing vessel 110 from the outside.

In the following, operation and effect of the vacuum processing apparatus 100 as configured above will be explained.

When the processing vessel 110 is opened in the vacuum processing apparatus 100, first, the lid 112 is elevated from the vessel main body 111 manually or by using any driving source (electric motor, fluid pressure cylinder, etc.). At this time, the rotation of the lid 112 is controlled by control structure such as the rotation lock unit 132c, the supported material 137 or the like, until the lid 112 is disposed at a predetermined height. Accordingly, it is possible to carry out safe and easy manipulation in case of performing, e.g., manual operation. Further, at this time, the lid 112 can be elevated, i.e., translated upward while being supported and basically maintaining its orientation (at horizontal position).

If the lid 112 is elevated to a predetermined height, it is rotated around the shaft 133 (vertical axis line), and thus, being dislocated from the vessel main body 111 in the horizontal direction as described in FIG. 2. At this time, since the supported member 137 is placed and supported on the supporting surface 134b of the fixing member 134, the height of rotating lid 112 is kept during the rotation thereof even though it is not supported.

FIG. 2 shows as a dashed double-dotted line a state where the lid 112 is fully opened. In such a state, the lid 112 and the source material supply box 121 are not disposed above the vessel main body 111, so that maintenance (cleaning or repair of equipment) of the processing vessel 110 can be performed very easily.

In the vacuum processing apparatus 100 of the present embodiment, the source material supply system 120 is disposed at a position right above the lid 112, which was dead space conventionally. Therefore, the overall apparatus can be made compact. Further, it is possible to directly supply the source material into the processing vessel 110 from the upper portion, to thereby shorten the source material supply line while increasing the line's conductance. Hence, the amount of source material to be supplied can be maintained steadily, and at the same time, the source material can be prevented from being changed while supplying it. Accordingly, the processing can be performed by using various source materials smoothly.

To be more specific, in case where the source gas is discharged from the source material vessel 122 by vacuum-exhaustion of the processing vessel 110 by the gas exhaust system 140, if conductance of the source material supply line 123 is low, the amount of source gas to be supplied cannot be kept or the source gas may be changed in the supply line. However, in the present embodiment, it is possible to avoid such a problem by increasing conductance of the source material supply line 123.

Particularly, in the present embodiment, since the source material supply system 120 is fixed on the lid 112, the lid 112 and the source material supply system 120 can be rigidly coupled to each other. Accordingly, the configuration can be simplified, and at the same time, the source gas can be prevented from being contaminated. Further, in the present embodiment, in case of performing vacuum-exhaustion of source material vessel 122 or various lines, vacuum level may be increased.

For example, if the source material is solid, it is sublimated to produce source gas, which is supplied into the processing vessel 110. In this case, it may be difficult to maintain the amount of source gas to be supplied, depending on the characteristics of the source material. However, in the present embodiment, the length of source material supply line 123 can be reduced, and the diameter of line can be large without interfering with surrounding structures. For the same reason, the amount of source gas to be supplied can be ensured, and thus, the processing can be performed smoothly.

Further, when vaporizing liquid source material other than organic metal and supplying it from the supply line 123 into the processing vessel 110, if the conductance of supply line 123 is small, the source material may be liquefied or decomposed in the line. If the liquefied or decomposed product is supplied into the processing vessel, the processing quality may be degraded. However, in the present embodiment, since the conductance of supply line is increased, the source material supply condition can be improved and high quality processing can be performed.

In the present embodiment, since the position of the lid 112 is not changed during the opening or closing thereof, the source material vessel 122 can be disposed above the lid 112 without causing any problem. Further, even though the lid 112 and the source material vessel 122 are fixed to each other, the status of source material accommodated in the source material vessel 122 is not changed, i.e., the source material is not tilted in the source material vessel 122, since the position of the source material vessel 122 is not changed. Therefore, the supply amount of source material and the supply status may be stabilized.

In the present embodiment, the length of the source material supply line 123 may be set in the range of 30~100 cm, and practically, about 70~80 cm. Further, the line diameter may be configured in the range of 20~80 mm, and preferably, large diameter of 30~50 mm may be employed.

In the present embodiment, the vacuum processing apparatus has a depressurized processing vessel, in which any processings may be carried out. As for the vacuum processing apparatus, film forming apparatus such as CVD, etching apparatus such as dry etching, ashing apparatus such as plasma asher, heat treating device such as annealing furnace or the like, may be enumerated.

What is claimed is:

1. A vacuum processing apparatus comprising:
   a processing vessel having an inside that can be depressurized, the processing vessel including a vessel main body having an upper opening and a lid for airtightly closing the upper opening of the vessel main body;
   a lid support mechanism for opening or closing the upper opening of the vessel main body by moving the lid; and
   a source material vessel system disposed above the lid and having a source material vessel which accommodates therein a source material, the source material vessel system supplying a source gas generated from the source material into the processing vessel,
   wherein the source material vessel system further includes a source gas supply line, extending from the source material vessel to an upper portion of the lid, for supplying the source gas into the processing vessel through the lid,
   wherein the vacuum processing apparatus further comprises an additional gas supply line for supplying a carrier gas or a cleaning gas, and
   wherein the additional gas supply line is introduced into the vessel main body from outside of the vessel main body, and wherein the additional gas supply line extends through the vessel main body, and then extends through the lid and is connected to the source gas supply line, and wherein the carrier gas or the cleaning gas is introduced into the inside of the processing vessel by first passing through the additional gas supply line, then through the source gas supply line, and then into the inside of the processing vessel.

2. The vacuum processing apparatus of claim 1, wherein the lid support mechanism allows the lid to be translated in a vertical direction, and to be rotated around a vertical axis line disposed at a peripheral position of the lid when the lid is elevated from the vessel main body.

3. The vacuum processing apparatus of claim 2, wherein the lid support mechanism is configured to maintain the lid at a predetermined height while the lid is rotated.

4. The vacuum processing apparatus of claim 2, wherein the lid support mechanism has a supporting member for supporting the lid directly or indirectly, and wherein the supporting member extends substantially horizontally above the lid from the vicinity of the vertical axis line.

5. The vacuum processing apparatus of claim 2, further comprising a lifting unit for upwardly lifting the lid.

6. The vacuum processing apparatus of claim 2,
   wherein the source material vessel is immovably disposed with respect to the lid, and
   wherein during movement of the lid, a relative position between the lid and the source material vessel is not changed so that the source material accommodated therein is not tilted.

7. The vacuum processing apparatus of claim 6, wherein the source gas supply line is immovably disposed with respect to the lid, and
   wherein a relative position between the lid and the source gas supply line is not changed.

8. The vacuum processing apparatus of claim 1, wherein the source material vessel is immovably disposed with respect to the lid.

9. The vacuum processing apparatus of claim 1, wherein the source gas supply line is immovably disposed with respect to the lid.

10. The vacuum processing apparatus of claim 1, wherein the source gas supply line is immovably disposed with respect to the lid.

11. The vacuum processing apparatus of claim 1, wherein the apparatus includes a pump to reduce pressure in said processing vessel.

12. The vacuum processing apparatus of claim 11, wherein the source material vessel includes the source material in a non-gaseous state, and wherein the source material is supplied to the processing vessel in a gaseous state.

13. The vacuum processing apparatus of claim 1, wherein the source material vessel includes the source material in a non-gaseous state, and wherein the source material is supplied to the processing vessel in a gaseous state.

14. The vacuum processing apparatus of claim 1, wherein the vessel main body has a top surface at which the upper opening is formed, and the additional gas supply line is connected to the source gas supply line via the top surface.

* * * * *